(12) United States Patent
Williams (10) Patent No.: US 11,262,410 B2
(45) Date of Patent: Mar. 1, 2022

(54) DETERMINING BATTERY LIFE BASED ON TEMPERATURE AND VOLTAGE

(71) Applicant: Aclara Technologies LLC, St. Louis, MO (US)

(72) Inventor: Randy John Williams, Sandy, UT (US)

(73) Assignee: Aclara Technologies, LLC, St. Louis, MO (US)

( * ) Notice: Subject to any disclaimer, the term of this patent is extended or adjusted under 35 U.S.C. 154(b) by 7 days.

(21) Appl. No.: 16/843,550

(22) Filed: Apr. 8, 2020

(65) Prior Publication Data

US 2020/0319254 A1  Oct. 8, 2020

Related U.S. Application Data (60) Provisional application No. 62/830,632, filed on Apr. 8, 2019.

(51) Int. Cl.

| | |
|---|---|
| *G01R 31/3835* | (2019.01) |
| *H01M 10/48* | (2006.01) |
| *G01R 31/392* | (2019.01) |
| *G01R 31/367* | (2019.01) |

(52) U.S. Cl.
CPC ....... *G01R 31/3835* (2019.01); *G01R 31/367* (2019.01); *G01R 31/392* (2019.01); *H01M 10/486* (2013.01)

(58) Field of Classification Search
None
See application file for complete search history.

(56) References Cited

U.S. PATENT DOCUMENTS

| | | | |
|---|---|---|---|
| 4,682,169 A * | 7/1987 | Swanson | G01R 11/16 340/870.02 |
| 6,111,519 A | 8/2000 | Bloss, Jr. et al. | |
| 2002/0041237 A1* | 4/2002 | Nathan | G01D 11/24 340/870.02 |
| 2010/0250162 A1 | 9/2010 | White et al. | |
| 2013/0085695 A1* | 4/2013 | Ono | G01R 31/3835 702/63 |

(Continued)

OTHER PUBLICATIONS

PCT/US2020/027255 International Search Report and Written Opinion dated Jul. 16, 2020 (13 pages).

*Primary Examiner* — Jas A Sanghera
(74) *Attorney, Agent, or Firm* — Michael Best & Friedrich LLP (57) ABSTRACT

A system and method to determine battery lifetime of a remote meter transmission unit. Disclosed methods may comprise sampling a meter transmission unit's voltage and temperature while the unit is not transmitting any data; selecting a temperature curve based on the sampled temperature of the unit from a plurality of predetermined temperature curves, wherein each predetermined temperature curve representing the battery lifetime based on the unit's sampled voltage at the unit's sampled temperature; locating a position from the selected curve based on the voltage sampled of the unit; determining the battery's electrical power consumed and remained based on the position of the curve; and determining the battery's lifetime based on the power consumed and remained. The disclosed method may be used to estimate the battery's remaining lifetime. Disclosed products may utilize the disclosed method.

20 Claims, 9 Drawing Sheets

(56) References Cited

U.S. PATENT DOCUMENTS

| | | | |
|---|---|---|---|
| 2014/0084873 A1* | 3/2014 | Sim | H02J 7/0091 |
| | | | 320/134 |
| 2014/0129163 A1 | 5/2014 | Betzner | |
| 2019/0011283 A1* | 1/2019 | Soutar | G01D 4/004 |

* cited by examiner

DETERMINING BATTERY LIFE BASED ON TEMPERATURE AND VOLTAGE

BACKGROUND

A Meter Transmission Unit (MTU) may be a battery-powered unit used to transmit metered usage of power in residential as well as commercial applications to a head end so that metered power usage may be read remotely. Such transmission may occur over a network such as but not limited to an over-the-air network such as but not limited to a radio frequency network, a cellular network, or a wifi-network, MTUs may also allow two-way communications for electric meters and other smart-infrastructure devices on such networks. Further, a properly constructed MTU facilitates a reduction in risks to power utility personnel and ensures accurate, reliable and efficient transmission of meter measurements. To assure that these benefits are delivered reliably, MTUs are often sealed such that they are impervious to the elements and possibly also embedded in a meter or otherwise placed in a largely inaccessible or difficult to reach location so that the MTU cannot be tampered with or damaged. As a side effect of such means to protect an MTU from damage, replacing the batteries of the MTUs is highly impractical as cost prohibitive, time inefficient, necessitating of new training, and unduly demanding on replacement crew members, among other things. For at least these reasons, an MTU is generally replaced when its battery is dead or dying. Therefore, the battery life of an MTU is, as a practical matter, seen as the lifetime of the MTU itself. There is thus a need for an accurate method of predicting the battery life of MTUs so that an efficient prediction can be made as to whether an MTUs battery is dying with enough lead time to be replaced in an temporally, fiscally, and technically economic manner.

The battery life of an MTU is one of the most critical parameters of MTU products functionality. One of the critical parameters surrounding MTUs is the expectation that they will have a very long battery life. Estimating battery life can seem to be a trivial exercise that only takes into account the battery capacity and average loading on the battery. This assumption is typically true in use cases where current draw is heavy and temperature ranges stay relatively constant. However, when the battery is placed in a use case that requires extremely low average current draw and heavily varying temperature, this assumption is no longer valid. Further, it should be noted that due to the sealed, enclosed nature of the battery powering an MTU, cost considerations as well as logistical considerations make battery placement difficult, cost-prohibitive, or even impossible. Thus, often times the entire MTU must be replaced when the MTU battery dies. This can cause drag on the meter system and network, and current battery battery estimation methods have not adequately mitigated this drag. There is therefore a need for a method of replacing MTUs in a meter network according to an accurate battery life prediction system with a long predictive range based upon current data.

In addition to the complexity of estimating battery life with these new factors, the question is raised on how to determine where the battery lies in its lifetime calculation at any given moment. This determination adds even more levels of complexity as the determination depends on previous loading, temperature profile, current loading and current temperature, along with other nuances that come with how far along the lifetime curve the battery is. There is therefore a need for a method of battery lifetime estimation that takes numerous factors into account to provide an accurate estimate for when an MTU may need to be replaced.

SUMMARY

The disclosed method of and products for MTU battery life expectancy determination use a predictive algorithm that may be tailored to a utility provider's specific MTU load profile. The disclosed methods and products are useful to a utility provider seeking MTUs lasting longer than 10 years by way giving the utility provider an indication on when it should expect an MTU to actually hit the MTUs end of life. Temperature swings, load profiles, and battery characteristics become complex and difficult to track because many MTUs and meters are positioned outdoors. The methods and products disclosed herein help to simplify things by, as a non-limiting example, reading an MTU battery voltage and temperature to make a determination on the estimated remaining MTU battery capacity. The disclosed methods and products therefore help prepare, in advance, for MTU replacement so that utility providers are not overwhelmed with a mass MTU failure as well as guarding utility providers utilizing MTUs against early MTU failures.

In one aspect, a method in accordance with the present disclosure enables the determination of an expected lifetime of an MTU based upon information derived from a battery life curve. A method for determining battery lifetime of a remote meter transmission unit may comprise: sampling the unit's voltage and temperature while the unit is not transmitting any data; selecting a temperature curve based on the sampled temperature of the unit from a plurality of predetermined temperature curves, wherein each predetermined temperature curve representing the battery lifetime based on the unit's sampled voltage at the unit's sampled temperature; locating a position from the selected curve based on the voltage sampled of the unit; determining the battery's electrical power consumed and remained based on the position of the curve; and determining the battery's lifetime based on the power consumed and remained.

In another aspect, the present disclosure provides a way that the each predetermined temperature curve is generated based on a voltage modification VT, a capacity C, the sampled temperature T.

In an additional aspect, the present disclosure may alert a data collecting unit or a head-end of a potential failure if the sampled voltage value less the amount of sag $V_{sag}$ is below any lowest voltage for transmitting data.

In a further aspect, sampling the unit's voltage and temperature multiple times and averaging the voltage sampled and the temperature sampled provide a more accurate estimation.

In an additional aspect, mapping out multiple unit's battery lifetime provides further analysis of batteries.

In an aspect, the present disclosure provides a system for determining battery lifetime of a remote meter transmission unit that may comprise: a receiver component receiving signal from the remote meter transmission unit, wherein the signal including the unit's temperature and voltage; a digital processor executing: a digital processor component receiving information regarding the unit's temperature and voltage and sampling the unit's voltage and temperature while the unit does not transmitting any data; a digital curve selection component selecting a temperature curve based on the sampled temperature of the unit from a plurality of predetermined temperature curves, wherein each predetermined temperature curve representing the battery lifetime based on the unit's sampled voltage at the unit's sampled temperature; a digital location component locating a position from the selected curve based on the voltage sampled of the unit; a digital power determination component determining the battery's electrical power consumed and remained based on the position of the curve; and a digital lifetime determination component determining the battery's lifetime based on the power consumed and remained.

In another aspect, the digital processor may further comprise a curve generating component generating the each predetermined temperature curve based on a voltage modification VT, a capacity C, and the sampled temperature T.

In an additional aspect, a first altering component may alert a data collecting unit or a head-end of a potential failure if the sampled voltage value less the amount of sag $V_{sag}$ is below any lowest voltage for transmitting data.

In an additional aspect of the present disclosure, a functionality determination component may determine a meter transmission unit's functionality based on whether the meter transmission unit's current lifetime follows along the predetermined curve at the current temperature.

Other objects and features will be in part apparent and in part pointed out hereinafter.

BRIEF DESCRIPTION OF THE DRAWINGS

FIG. 3 illustrates three data sets along with an approximated curve fit for the

Corresponding reference characters indicate corresponding parts throughout the drawings.

DETAILED DESCRIPTION

In a number of aspects, determination of an MTU battery life may comprise determining an expected battery life based as stated on a spec sheet, as provided by a manufacturer via a discharge curve, datasheet, or the like, or as expected under normal operating conditions. Determination of an MTU battery life may further comprise accounting for variations in power draws on the MTU battery due to environmental variations such as but not limited to changes in moisture, contamination such as but not limited to metallic dust or shavings, or temperature, or technical variations such as but not limited to the appearance corrosion, shorts, or failures due to manufacturing, poor design, trauma, misuse, intervention, or unintended degradation. Such environmental variations may be sensed directly by dedicated sensors or circuits, or deduced by software analysis of sensor readings.

In a number of aspects, it is contemplated that the methods or products disclosed in 62/781,114 may be used in conjunction with the methods or products of the present disclosure. As a non-limiting example, the contaminant detection circuit of 62/781,114 may be used to confirm that moisture is causing an increase in current draw or power draw on an MTU battery, or a current draw or power draw spike on an MTU battery. As such, the contaminant detection circuit may also be used in debugging a seemingly faulty MTU by enabling the possibility of detectable contaminants being the cause of the increased draw or fault.

In a number of aspects, an MTU may draw power from any number of battery types including but not limited to cell lithium batteries with a LiFeS2 (Lithium Iron Disulfide) chemistry or cell lithium batteries having a Li/SOCl2 (Lithium Thionyl Chloride or LTC) chemistry. The LiFeS2 is a high-current, low-leakage device while the Li/SOCl2 is a low-current, low-leakage device. While low-leakage battery devices come with intrinsic reliability characteristics, numerous battery types are contemplated for use with an MTU by the methods and products disclosed herein, such as but not limited to Zinc-Carbon batteries, Alkaline batteries, Lithium-Thionyl Chloride batteries, Lithium Manganese Dioxide batteries, Lithium Sulfur Dioxide batteries.

In a number of aspects, determination of an MTU battery life may comprise correlating a voltage reading from a particular MTU battery to data representative of known variations in lifetimes of MTU batteries of a particular type as caused by variations in temperature. In such a case, determination of the MTU battery life may further comprise correlating the temperature of the particular MTU battery at the time of the voltage reading to the data reflecting known variations in lifetimes of MTU batteries of a particular type as caused by variations in temperature. In such a case, the data reflecting known effects on lifetimes of MTU batteries of a particular type as caused by variations in temperature may comprise a number of discharge curves for MTU batteries of a particular type at a number of temperatures or over a number of temperature differentials.

In a number of aspects, upon a determination of low MTU battery life expectancy, a notification or alert may be communicated to a head end, a technician, a monitoring system, or any other group or service tasked in whole or part with ensuring proper operation of the meter or MTU. This notification or alert may be communicated by the MTU or a meter component. Further, this notification may be accomplished by the raising of a flag in a connected software system or component.

In a number of aspects, a notification of low MTU battery life expectancy may be handled or responded to by the utility provider by preparing for the failure of the MTU. Such preparation may comprise items such as but not limited to alerting software, a headend, utility crews, management teams, or individuals that transmissions by the MTU may cease or become unreliable, scheduling a replacement, or initiating an investigation. Scheduling of a replacement of the MTU may occur autonomously, for example, by a computerized scheduling system or may occur manually by conventional means. It is contemplated that a determination of low MTU battery life expectancy may be correlated to detectable events in the MTU's life and used as feedback for any replacement MTU or MTUs placed in similar circumstances. To that end, it is comprehended from the disclosure herein that the systems and methods herein enable projection and prediction of early failure of an MTU due to early battery failure and that identification of early failure grants the foresight to avoid mistake, lag, or failure of the metering network by enabling timely predictive replacement of dying or failing MTUs.

In a number of aspects, a determination of low MTU battery life expectancy may be compared to an ideal or normal life expectancy for an MTU having similar traits in similar circumstances. In such cases, if the determination of low MTU battery life expectancy is determined have occurred abnormally early in view of the aforementioned comparison, it may be deduced that the MTU battery life expectancy is low due to trauma or defect of the MTU or meter. For example, an increase in power draw may be due to occurrences such as but not limited to contamination, water intrusion, tampering, or circuit failure.

In a number of aspects, an MTU may be subject to a number of occurrences over the course of its lifetime during which more current or power is drawn from the MTU battery than in a steady state. In some cases, the MTU may draw extra power or current from the MTU battery while transmitting data over a network. As a non-limiting example, an MTU may draw about 750 mA for about 70 ms for the purpose of making a radio transmission over an RF network. In some cases, an MTU may be constructed and arranged to send and receive transmissions over a network. An MTU so constructed and arranged may also transmit meter measurements to a receiver on demand. In order to facilitate on-demand meter measurement transmission, an MTU may execute temporary on-demand listen windows to listen for demands to the MTU for a meter measurement transmission from any device capable of making such a demand. For example, an MTU may be configured to listen for a demand every 3 minutes, thus creating a current draw of 5 mA on the battery for 300 ms. As further non-limiting examples, certain occurrences may also cause increase current or power draw on the MTU battery. Such events may be synchronous or asynchronous in nature. As a few non-limiting examples, the MTU may run memory operations, security checks, component calibration such as but not limited to general radio servicing, firmware upgrades, and so forth. In some such cases, any of the aforementioned occurrences or similar occurrences may be accounted for when determining an MTU's battery life expectancy. Further, readings concerning MTU battery capacity, voltage, current draw, or power draw may be strategically taken either during an increased current or power draw occurrence or strategically taken outside of such an occurrence as part of the MTU battery lifetime expectancy determination method. As a non-limiting example, an MTU or an associated meter may be programmed to read the MTU battery's capacity, voltage, current draw, or power draw while no occurrence of increased current or power draw is occurring for the purpose of getting a steady-state picture of the MTU battery for correlation to data taken during a strategically similar period for another MTU battery and thus ensuring a closer comparison and more accurate estimation of MTU battery life expectancy.

An evaluation of data provided by the battery manufacturer along with test data may allow for a better picture of how to estimate both battery lifetime calculations and determination of location on the battery lifetime curve.

Being able to determine where the MTU sits in its lifetime may provide critical information regarding use and warranty. Using salient features of the battery, this lifetime curve can be predicted and may be used to determine life and use of the MTU.

The present disclosure shows how to determine where an MTU lies on a battery life curve based on the current temperature and the average expected loading of the MTU along with assumptions used to arrive at the determination.

Determination of the battery life comprises two sections. The first section is to determine what the lifetime curve should be. This may require an estimation of MTU usage paired with the manufacturer's lifetime curves. The second section will deal with variations on the first curve due to temperature. The combination of the two curves can be put together in a curve fit that uses as variables voltage and temperature to determine place on the lifetime curve as well as potential remaining life estimation.

Battery lifetime curve estimation is related to (A) MTU Usage, (B) Battery Lifetime Curves, and (C) Voltage Sag Due To Loading.

A. MTU Usage

The MTU to be discussed has four main categories that may comprise more than 93% of the total battery usage: On-Demand Windows, Transmissions, Quiescent (sleep) events and Meter Reading. There are various other things that may happen throughout the lifetime of the MTU that may be very infrequent and may make a small effect on battery life, but may not be nearly as significant as the big four.

The battery usage curve may be complicated because an MTU battery may use two busses to create energy for two sections of the MTU circuitry. A low-current, low leakage AA battery may be used to power the microprocessor and the low-power circuitry where the high-current, low leakage stack may be used for the high energy circuitry, primarily the transmission portion. This separates the four categories above between the two battery stacks.

The functionality of a particular MTU to be discussed herein takes on the following characteristics:
Transmissions 4 times daily
Hourly meter reads
3-minute intervals for "On-Demand Listen Windows"
Hourly real time clock (RTC) calibration
Daily Time-Synchronization
This translates to the usage summary found in Table 1 below.

TABLE 1

MTU Usage
MTU Usage Summary

| Category | low-current, low leakage | high-current, low leakage | Units |
|---|---|---|---|
| Transmissions | 0.006 | 3.93 | µAh/h |
| Quescent Events | 3.5 | 1 | µAh/h |
| Battery Self-Discharge (leakage) | 2.7 | 0.9 | µAh/h |
| On-Demand Listen Windows | 1.55 | 9.9 | µAh/h |
| Meter Reading | 2.25 | 0 | µAh/h |
| RTC Calibration | 0.71 | 0 | µAh/h |
| Total | 10.077 | 15.73 | µAh/h |
| Blanket Losses (additional to current draw) | 166 | 142 | mAh |

Knowing that the low-current, low leakage and high-current, low leakage batteries shown are similar in terms of capacity, it is easily seen that the high-current, low leakage battery may be the limiter in terms of life of an MTU depending on both batteries. It will also be shown that the low-current, low leakage battery may not lend itself to the process of determining location on the curve as easily as the high-current, low leakage battery does.

B. Battery Lifetime Curves

Figure 1:
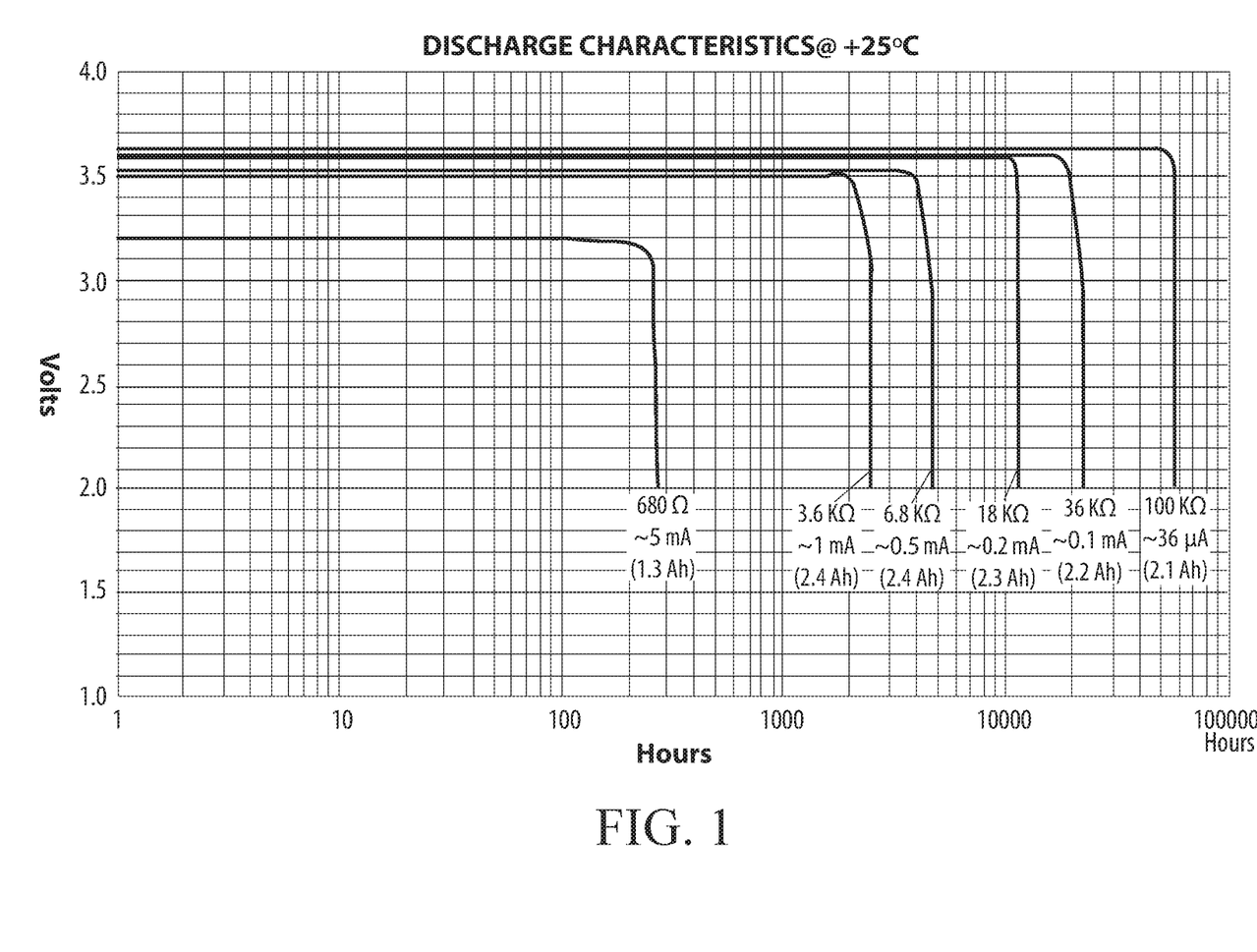
FIG. 1 is a discharge curve for a low-current, low leakage battery at 25° C.

The battery manufacturers typically provide discharge curves for their products. FIG. 1 shows the discharge curve for a low-current, low leakage battery TL-4903. It can be noted that the curve is very flat over the entire life of the battery, which may not lend itself to position detection based on voltage.

Figure 2:
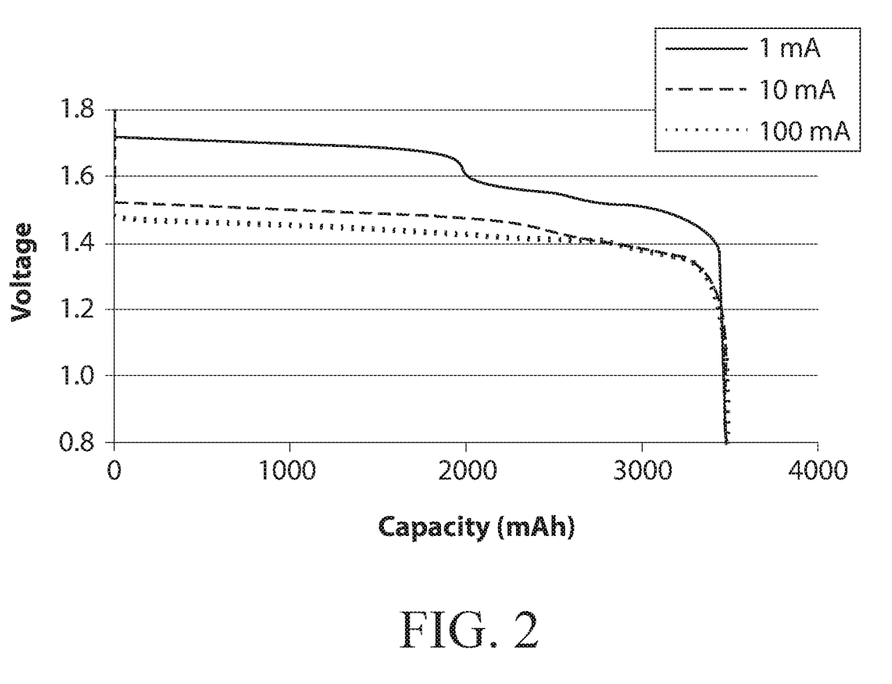
FIG. 2 shows the discharge curve for an high-current, low leakage battery.

Referring to FIG. 2, the discharge curve for the high-current, low leakage battery L91. For low-current applications, a discharge curve may provide an avenue of detecting of where a given MTU battery may land on a curve pertinent to its own specifications. This may give an idea of how many mAh have been used and how many remain. This, of course, depends heavily on knowing the loading of the battery or tracking the battery voltage over time to adjust the curves.

Figure 3:
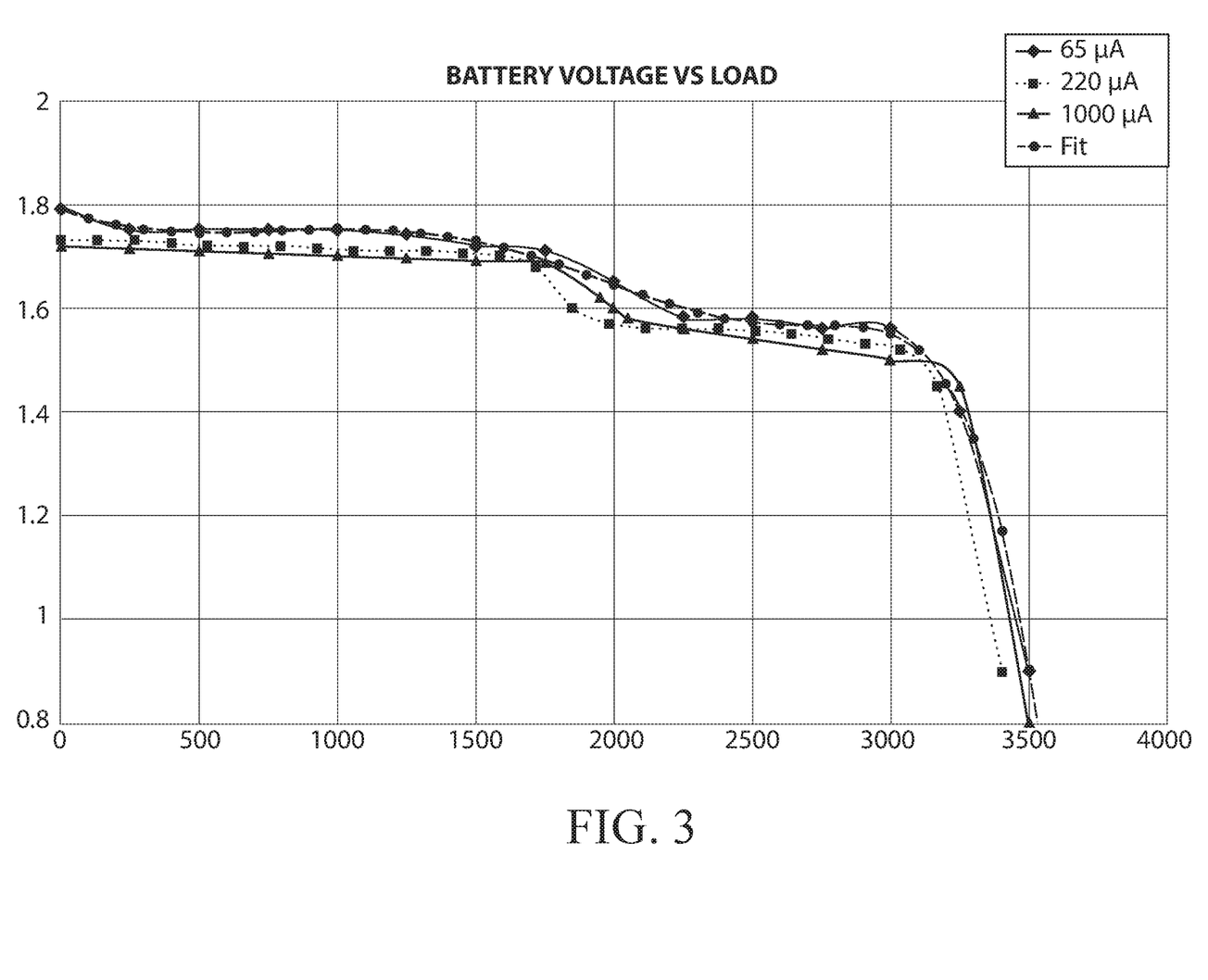

Data was gathered by a high-current, low leakage battery manufacturer detailing some low-current drain applications over time. FIG. 3 below shows the three data sets along with an approximated curve fit of the data. The plots show very little variability between 65 μA of drain and 1 mA of drain. This is fortunate, because the average current draw of the MTU may be close to 16 μA.

The curve fit of the data yields a 7th order polynomial described by equation (1) in terms of Voltage (V) and Capacity (C).

$$V = a + bC + cC^2 + dC^3 + eC^4 + fC^5 + gC^6 + hC^7 \quad (1)$$

Where:
a=1.79
b=−0.00021
c=4.11E−07
d=−4.57E−10
e=4.01E−13
f=−2.47E−16
g=7.75E−20
h=−9.06E−24

C. Voltage Sag Due to Loading

Figure 4:
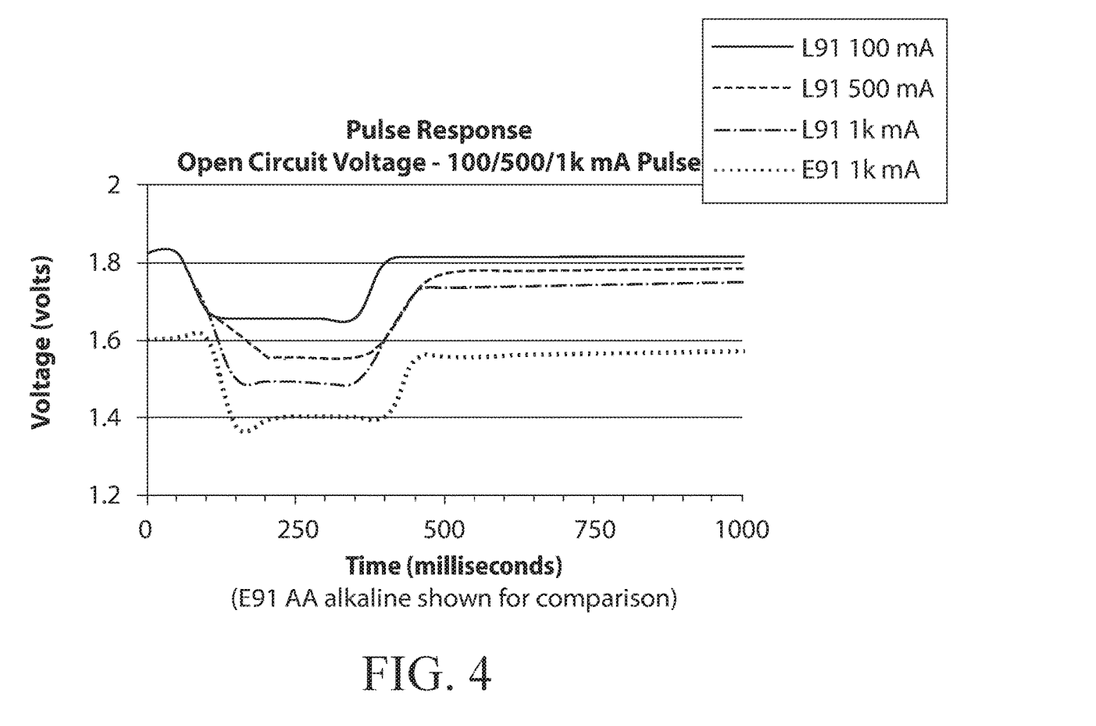
FIG. 4 illustrates voltage sag based on loading.

When a pulsed load is placed on a battery, the voltage may sag. This sag may be primarily due to the battery series resistance (BSR) which is found in the cell and may vary based on loading. FIG. 4 shows the voltage sag based on loading for a pulse of increased current or power draw on the battery. The unloaded battery voltage following the pulse may not return to the same level as prior to the pulse. This is because the chemical reaction in the battery may need some time to fully recover.

Manufacturers may recommend only measuring the voltage level during or after a pulse event to get the most accurate reading of the actual battery voltage. Another method is to provide ample time for the battery to fully recover. If the manufacturer's recommended approach is taken, then there may need to be an adjustment to the battery voltage in keeping with a manufacture's recommendation.

Figure 5:
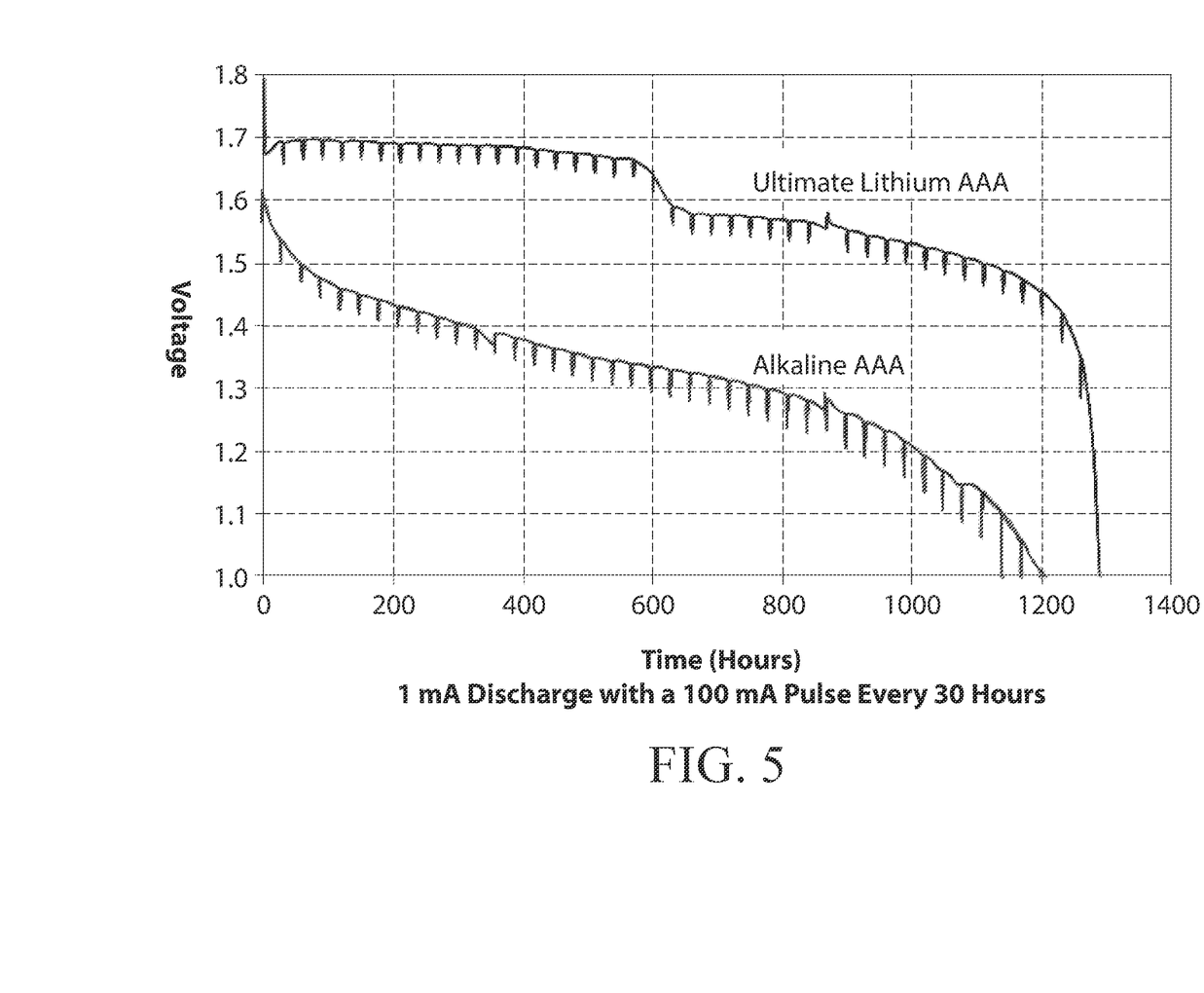
FIG. 5 illustrates a battery discharge curves with pulsed load.

Referring to FIG. 5, data shows that a sag created based on loading is fairly constant over the life of the battery. It can also be noted that the shown battery discharge curve shape is not affected by the pulses of increased current or power draw. The pulses do contribute to the capacity drain but positioning on the lifetime curve is still achievable.

Figure 6:
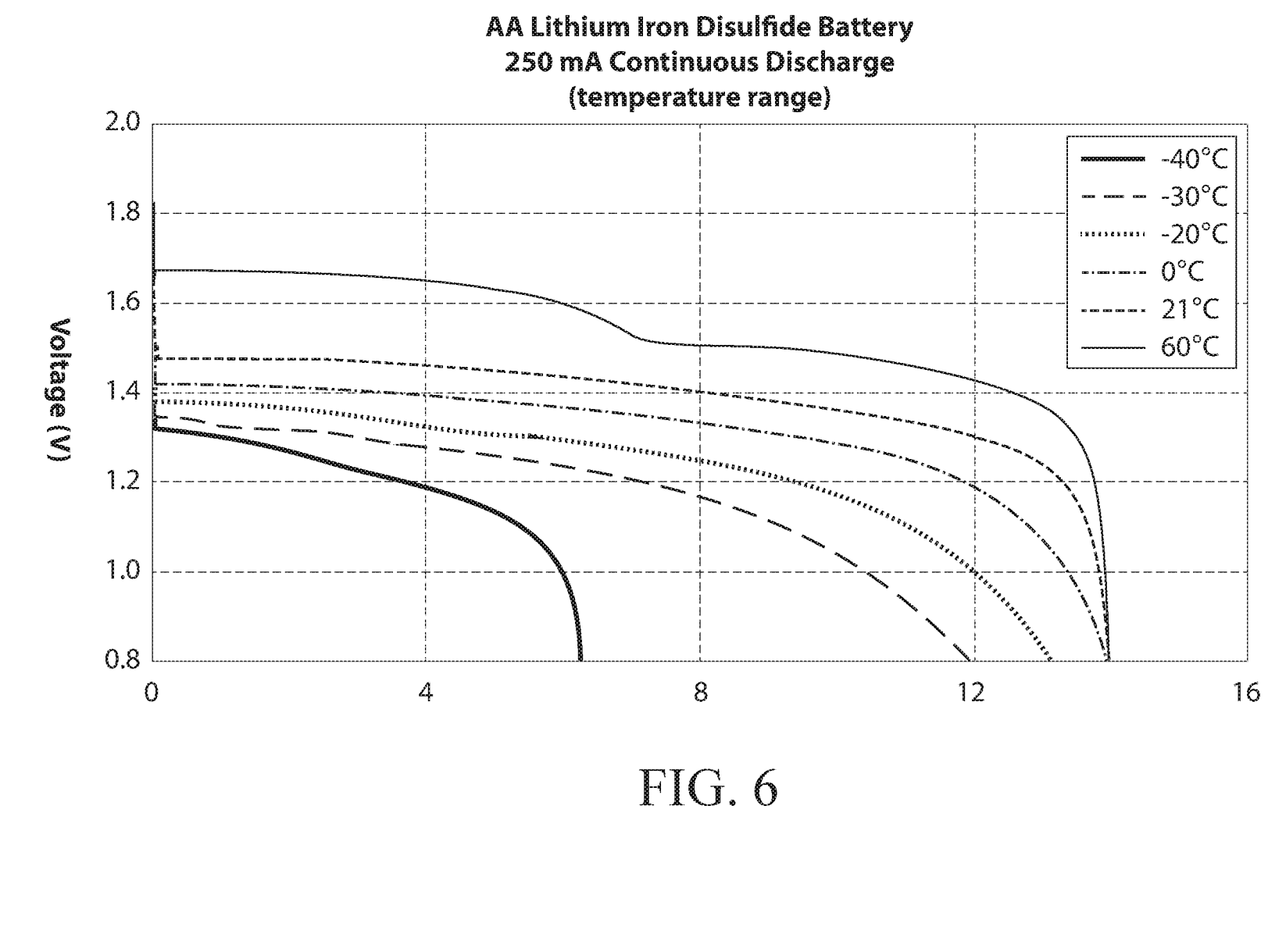
FIG. 6 illustrates temperature effects on voltage.

Referring to FIG. 6, reduction in temperature may create a slowing effect of the chemical reaction necessary for batteries to create energy. Batteries depend on these chemical reactions for their voltage potential. Because of this dependence, the battery voltage may drop as the temperature drops. This effect is showing in FIG. 6.

Figure 7:
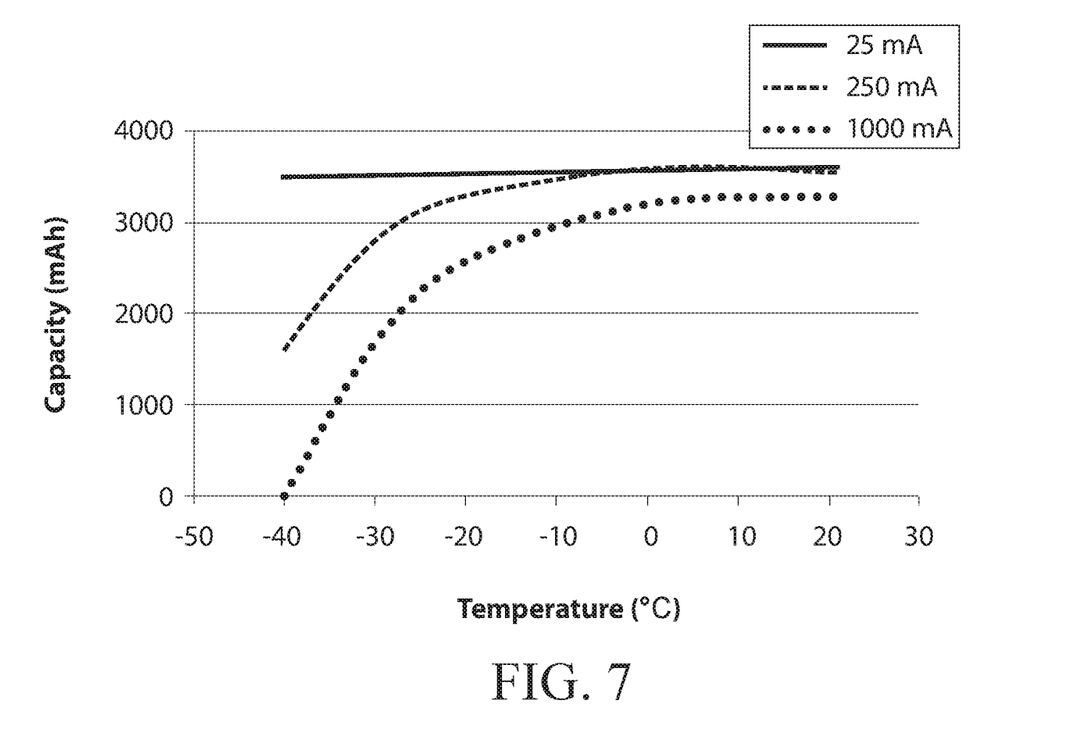
FIG. 7 illustrates temperature effects on capacity.

In cases of higher current draw, the drop in temperature may also affect the capacity of the battery. This may be apparent in FIG. 6. However, if the average drain is low, the temperature effect on capacity may dissipates to where it is negligible over a temperature range of the battery. This relationship is shown in FIG. 7.

Figure 8:
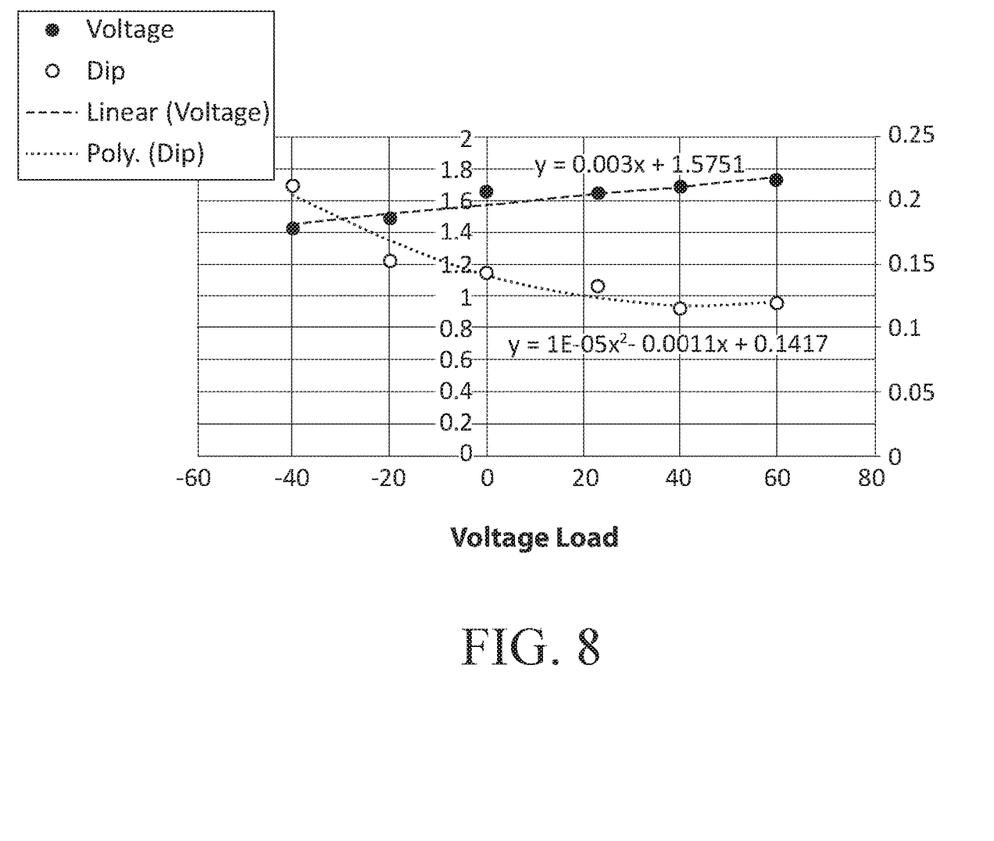
FIG. 8 illustrates voltage over temperature.

In the case of a particular style of MTU, the average current draw may be in the μA range, thus the capacity may not be affected by temperature in an overall fashion. The temperature may still affect the voltage of the battery in like fashion and the voltage sag may also increase slightly as temperature decreases. This increases because the drop in voltage may create an increase in current to maintain the same power level. Using the concepts previously discussed, voltage levels in FIG. 8 were taken during and directly after a pulse event so that temperature effect could be plotted. The results, along with the curve fit are shown in FIG. 8.

Taking the reading of the voltage may be desirable to do while the MTU is not transmitting. It may also simplify the modification equation to use. The voltage modification (VT) can be explained by equation (2) where T is the temperature in °C.

$$V_T = 0.003T + 1.571 \quad (2)$$

In addition it is important to note the equation to determine the minimum voltage that may be experienced during a pulse event. This may ultimately result in a failed transmission, though it may not register as an end-of-life event to the MTU because the battery voltage may immediately recover to a useable level and once the temperature subsides, it may return to operation. The equation for the amount of sag is given by equation (4).

$$V_{sag} = 1e{-}5T^2 - 1.1e{-}3T + 0.1417 \quad (4)$$

In addition to Combining equation (1) and equation (2) gives a modified temperature curve fit that can be used for estimation. The equation for the compensated voltage is given by equation (3).

$$V_c = 0.003T + a^* + bC + cC^2 + dC^3 eC^4 + fC^5 + gC^6 + hC^7 \quad (3)$$

Where:
a*=1.5751
b=−0.00021
c=4.11E−07
d=−4.57E−10
e=4.01E−13
f=−2.47E−16
g=7.75E−20
h=−9.06E−24

Figure 9:
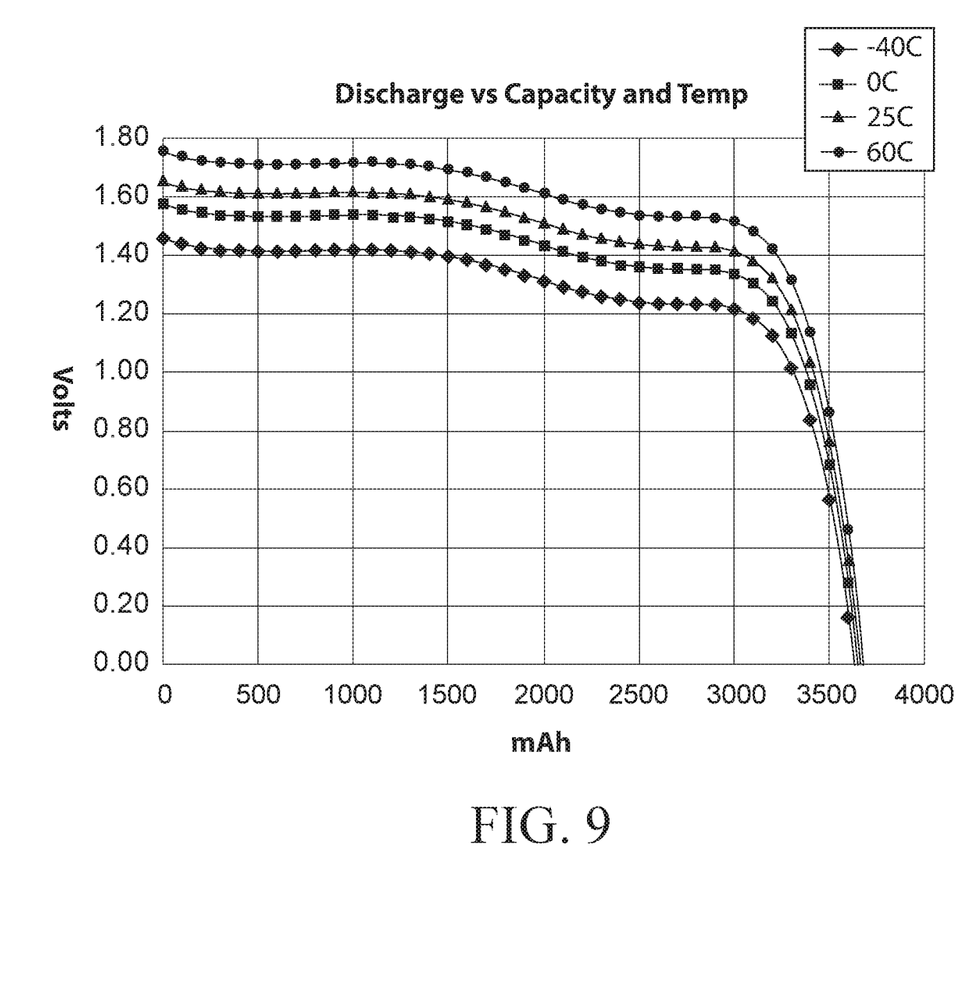
FIG. 9 illustrates voltage discharge curves overtemperature.

The graphical representation of this may be seen in FIG. 9 where the voltage level shifts based on temperature and gives which discharge curve that should be followed for estimation of battery life position on the curve.

D. Approximation of Life

After a transmission event, the voltage and temperature may be sampled. These two bits of information can lead to a deduction of how many mAh have been expended and how many remain. The temperature reading provides which curve is expected to be followed. It gives an offset from the room temperature value. The offset is a linear value of 0.003 V/°C. By reading the voltage, the position on the graph can be determined. This position could be compared to an expected lifetime curve to evaluate the accuracy of the estimate or to potentially diagnose problems with operation in the MTU.

A particular style of MTU may be powered by two high-current, low leakage batteries that are stacked in series. Such an arrangement would double the expected voltage values found in a single-battery system. The addition of a second battery is a simple modification. The information found on the approximation along with the sag value found in equation (4) may help to determine useful life of the product as well. A number of MTU styles can handle a minimum of 1.85 V from the batteries. In such cases, if the voltage value less the estimated sag of each battery is below 0.925 V, then the MTU may not successfully transmit. The MTU may thus alert the Data Collecting Unit (DCU) or the head-end of the potential failure, which may be due to a drop in temperature.

Under normal operations, it may be assumed that the high-current, low leakage battery will be at end of life when the battery voltage is 1V at room temperature. There may be some amount of capacity left, but the MTU may not transmit reliably beyond that point.

Each reading should be taken multiple times and averaged to try and filter out noise that may occur on the measurement lines. This will give a better estimate.

An aspect of advantage of the present disclosure is that the amount of remaining life on the battery can be approximated on the basis of feedback from the MTU of the voltage and the temperature. The proper discharge curve can be generated based on the given temperature value.

Once the curve is generated, the voltage value allows the user to see where they reside on the curve. This information may indicate how much capacity has been used and how much remains. This information gives the ability to estimate total MTU lifetime as well as diagnose problems by seeing that the MTU is farther along the lifetime curve than expected. Alternatively, it may also show that the MTU is not progressing along the curve as far as expected, which may give clues of lessened functionality of the product.

The order of execution or performance of the operations in embodiments illustrated and described herein is not essential, unless otherwise specified. That is, the operations may be performed in any order, unless otherwise specified, and embodiments may include additional or fewer operations than those disclosed herein. For example, it is contemplated that executing or performing a particular operation before, contemporaneously with, or after another operation is within the scope of aspects of the disclosure.

When introducing elements of aspects of the disclosure or the embodiments thereof, the articles "a", "an", "the" and "said" are intended to mean that there are one or more of the elements. The terms "comprising", "including", and "having" are intended to be inclusive and mean that there may be additional elements other than the listed elements.

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A method for determining battery lifetime of a remote meter transmission unit constructed and arranged to transmit data comprising:
sampling a battery voltage and a battery temperature while the unit is not transmitting any data;
selecting a battery temperature curve based on the sampled battery temperature of the unit from a plurality of predetermined battery temperature curves, wherein each predetermined battery temperature curve represents a projected battery lifetime based on an associated sampled battery voltage at an associated sampled battery temperature;
locating a position on the selected battery temperature curve based on the sampled battery voltage;
determining battery electrical power consumed from the battery and battery electrical power remaining based on the located position on the battery temperature curve;
determining a battery lifetime estimate based on the battery electrical power consumed and battery electrical power remaining; and,
scheduling a predictive replacement of the meter transmission unit based at least upon the determined battery lifetime estimate.

2. The method of claim 1, wherein the each predetermined temperature curve is generated based on a battery voltage modification $V_T$, a battery capacity C, and the sampled battery temperature T.

3. The method of claim 1, further comprising:
determining an amount of battery voltage sag $V_{sag}$ based on the sampled temperature; and,
determining remaining electrical power of the battery.

4. The method of claim 3, further comprising alerting a data collecting unit or a head-end of a potential failure if the sampled battery voltage value less the amount of battery voltage sag $V_{sag}$ is below a minimum voltage for transmitting data.

5. The method of claim 1, further comprising alerting a data collecting unit or a head-end of a potential failure if the sampled battery voltage is lower than a minimum voltage for transmitting data.

6. The method of claim 1, wherein sampling the battery voltage and battery temperature of the unit further comprises:
sampling the battery voltage and battery temperature multiple times; and
averaging each battery voltage sampled as well as each temperature sampled.

7. The method of claim 1, further comprising determining functionality of the unit based on the predetermined curve at the current temperature.

8. The method of claim 1, further comprising mapping out a plurality of battery lifetimes for a plurality of units.

9. A system comprising:
a receiver component receiving a signal from a remote meter transmission unit comprising a battery and constructed and arranged to transmit data, wherein the signal includes the at least a battery temperature and a battery voltage associated with the battery;
a digital processor; and,
a computer-readable storage device storing processor-executable instructions that, when executed by the digital processor execute:
a digital processor sampling battery voltage and battery temperature while the unit is not transmitting any data;
a digital curve selection component selecting a battery temperature curve based on the sampled battery temperature from a plurality of predetermined battery temperature curves, wherein each predetermined battery temperature curve represents a projected battery lifetime based on an associated sampled voltage at an associated sampled temperature;
a digital location component locating a position on the selected battery temperature curve based on the sampled battery voltage;
a digital power determination component determining the battery electrical power consumed and the battery electrical power remaining based on the located position on the curve;
a digital lifetime determination component determining a lifetime of the battery based on the battery electrical power consumed and battery electrical power remaining; and, a transmitter transmitting a message to an operator over a network in real time, so that the operator has immediate access to up-to-date information of any battery if the battery electrical power remaining is lower than a predetermined value.

10. The system of claim 9, wherein the digital processor further comprises
a curve generating component generating the each predetermined temperature curve based on a battery voltage modification, a battery capacity, and the sampled battery temperature.

11. The system of claim 9, wherein the digital processor further comprising:
a digital sag determination component determining an amount of battery voltage sag $V_{sag}$ based on the sampled battery temperature; and
a remaining power determination component determining battery electrical power remaining.

12. The system of claim 11, wherein the processor-executable instructions executed by the digital processor further comprises a first alerting component alerting a data collecting unit or a head-end of a potential failure if the sampled battery voltage value less the amount of battery voltage sag $V_{sag}$ is below a minimum voltage for transmitting data.

13. The system of claim 9, wherein the processor-executable instructions executed by the digital processor further comprises a second alerting component alerting a data collecting unit or a head-end of a potential failure if the sampled battery voltage is lower than a minimum battery voltage for transmitting data at room temperature.

14. The system of claim 9, wherein the digital processor samples the battery voltage and battery temperature multiple times and averages the battery voltage sampled and the battery temperature sampled.

15. The system of claim 9, wherein the processor-executable instructions executed by the digital processor further comprise a functionality determination component determining a functionality of the unit based on whether the current battery lifetime follows along the predetermined battery curve at the current battery temperature.

16. The system of claim 9, wherein the processor-executable instructions executed by the digital processor further comprises a mapping component mapping out a plurality of battery lifetimes for a plurality of units.

17. A method for predicting failure of a remote meter transmission unit constructed and arranged to transmit data comprising:
sampling a battery voltage and a battery temperature while the unit is not transmitting any data;
selecting a battery temperature curve based on the sampled battery temperature of the unit from a plurality of predetermined battery temperature curves, wherein each predetermined battery temperature curve represents a projected battery lifetime based on an associated sampled battery voltage at an associated sampled battery temperature;
locating a position on the selected battery temperature curve based on the sampled battery voltage;
determining battery electrical power consumed from the battery and battery electrical power remaining based on the located position on the battery temperature curve;
determining from the battery electrical power consumed that the battery is drawing an unexpected amount of power as compared to the battery temperature curve; and,
scheduling a predictive replacement of the meter transmission unit based at least upon the determination that the battery is drawing an unexpected amount of power as compared to the battery temperature curve.

18. The method of claim 17 further comprising determining the battery is drawing an unexpected amount of power due to contamination accumulation in a meter housing.

19. The method claim 18 wherein determining that the battery is drawing an unexpected amount of power due to contaminant accumulation in a meter housing comprises the utilization of a contaminant detection circuit.

20. The method of claim 17 further comprising determining the battery is drawing an unexpected amount of power due to circuit failure.

* * * * *